(12) United States Patent
Qiao et al.

(10) Patent No.: US 8,704,329 B2
(45) Date of Patent: Apr. 22, 2014

(54) SOI DEVICES FOR PLASMA DISPLAY PANEL DRIVER CHIP

(75) Inventors: Ming Qiao, Chengdu (CN); Bo Luo, Chengdu (CN); Xi Hu, Chengdu (CN); Jun Ye, Chengdu (CN); Bo Zhang, Chengdu (CN); Zhaoji Li, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 13/503,684

(22) PCT Filed: Dec. 29, 2010

(86) PCT No.: PCT/CN2010/080433
§ 371 (c)(1),
(2), (4) Date: Apr. 24, 2012

(87) PCT Pub. No.: WO2012/079262
PCT Pub. Date: Jun. 21, 2012

(65) Prior Publication Data
US 2013/0256800 A1    Oct. 3, 2013

(30) Foreign Application Priority Data
Dec. 17, 2010   (CN) .......................... 2010 1 0594793

(51) Int. Cl.
*H01L 29/00*   (2006.01)

(52) U.S. Cl.
USPC ............ 257/500; 257/E25.029; 257/E21.545; 257/502

(58) Field of Classification Search
USPC ........... 257/E25.029, E21.545, 500–502, 370
See application file for complete search history.

(56) References Cited

U.S. PATENT DOCUMENTS

| 4,628,341 | A | * | 12/1986 | Thomas | 257/338 |
| 5,005,066 | A | * | 4/1991 | Chen | 257/315 |
| 5,856,695 | A | * | 1/1999 | Ito et al. | 257/370 |
| 6,410,938 | B1 | | 6/2002 | Xiang | |
| 6,867,103 | B1 | | 3/2005 | Yu | |

(Continued)

FOREIGN PATENT DOCUMENTS

| CN | 101477999 A | 7/2009 |
| CN | 101515586 A | 8/2009 |
| WO | 2009/150636 A1 | 12/2009 |

OTHER PUBLICATIONS

Lee et al., "SOI High Voltage Integrated Circuit Technology for Plasma Display Panel Drivers," 1999 IEEE, pp. 285-288.

(Continued)

*Primary Examiner* — Matthew W Such
*Assistant Examiner* — Ali Naraghi
(74) *Attorney, Agent, or Firm* — Kilpatrick Townsend & Stockton LLP

(57)    ABSTRACT

SOI devices for plasma display panel driver chip, include a substrate, a buried oxide layer and an n-type SOI layer in a bottom-up order, where the SOI layer is integrated with an HV-NMOS device, an HV-PMOS device, a Field-PMOS device, an LIGBT device, a CMOS device, an NPN device, a PNP device and an HV-PNP device; the SOI layer includes an n+ doped region within the SOI layer at an interface between the n-type SOI layer and the buried oxide layer; and the n+ doped region has a higher doping concentration than the n-type SOI layer.

17 Claims, 5 Drawing Sheets

(56) References Cited

U.S. PATENT DOCUMENTS

| | | | |
|---|---|---|---|
| 7,009,259 B2* | 3/2006 | Ookubo et al. | 257/370 |
| 7,755,146 B2* | 7/2010 | Helm et al. | 257/370 |
| 7,884,440 B2* | 2/2011 | Chung | 257/499 |
| 8,278,731 B2* | 10/2012 | Sumitomo et al. | 257/510 |
| 2006/0157788 A1 | 7/2006 | Joshi | |
| 2009/0152668 A1* | 6/2009 | Sone et al. | 257/501 |
| 2009/0309167 A1* | 12/2009 | Russ et al. | 257/370 |
| 2010/0032766 A1* | 2/2010 | Chen et al. | 257/370 |
| 2010/0059851 A1* | 3/2010 | Ellis et al. | 257/500 |

OTHER PUBLICATIONS

Qiao et al., "High-Voltage Technology Based on Thin Layer SOI for Driving Plasma Display Panels," Proceedings of the 20th International Symposium on Power Semiconductor Devices & IC's, May 18-22, 2008, Orlando, Florida, pp. 52-55.

Kim, J., et al., "High-Voltage Power Integrated Circuit Technology Using SOI for Driving Plasma Display Panels," IEEE Transactions on Electron Devices, Jun. 2001, vol. 48, No. 6, pp. 1256-1263.

Kobayashi, K., et al., "High Voltage SOI CMOS IC Technology for Driving Plasma Display Panels," Proceedings of 1998 International Symposium on Power Semiconductor Devices and ICs, Jun. 1998, pp. 141-144.

Nitta, T., et al., "Wide Voltage Power Device Implementation in 0.25μm SOI BiC-DMOS," Proceedings of the 18th International Symposium on Power Semiconductor Devices and ICs, Jun. 2006, 4 pages.

Qiao, M., et al., "High-Voltage Thick Layer SOI Technology for PDP Scan Driver IC," Proceedings of the 23rd International Symposium on Power Semiconductor Devices and ICs, May 2011, pp. 180-183.

Roh, T., et al., "Highly Reliable LDMOSFETs Employing Uneven Racetrack Sources for PDP Driver Applications," Proceedings of the 14th International Symposium on Power Semiconductors and ICs, 2002, pp. 153-156.

Roh, T., et al., "Highly Reliable p-LDMOSFET with an Uneven Racetrack Source for PDP Driver IC Applications," Proceedings of the 15th International Symposium on Power Semiconductor Devices and ICs, Apr. 2003, pp. 236-239.

Sumida, H., et al., "The Characteristics of the Lateral IGBT on the Thin SOI Film When the Collector Voltage of the IGBT is Applied to the Substrate," IEEE Transactions on Electron Devices, Jul. 1994, vol. 41, No. 7, pp. 1301-1303.

Sumida, H., et al., "A High Performance Plasma Display Panel Driver IC Using SOI," Proceedings of 1998 International Symposium on Power Semiconductor Devices and ICs, Jun. 3-6, 1998, pp. 137-140.

Sumida, H., et al., "A High-Voltage Lateral IGBT with Significantly Improved On-State Characteristics on SOI for and Advances PDP Scan Driver IC," 2002 IEEE International SOI Conference, Oct. 2002, pp. 64-65.

Sumida, H., et al., "250V-Class Lateral SOI Devices for Driving HDTV PDPs," Proceedings of the 19th International Symposium on Power Semiconductor Devices and ICs, May 2007, pp. 229-232.

Sun, W., et al., "High-voltage power integrated circuit technology using bulk-silicon for plasma display panels data driver IC," Microelectronic Engineering, 2004, vol. 71, Iss. 1, pp. 112-118.

Sun, W., et al., High-Voltage Power IC Technology With nVDMOS, RESURF pLDMOS, and Novel Level-Shift Circuit for PDP Scan-Driver IC, IEEE Transactions on Electron Devices, Apr. 2006, vol. 53, No. 4, pp. 891-896.

Sun, Z., et al., "PDP Scan Driver with NVDMOS and RESURF PLDMOS," Proceedings of the 17th International Symposium on Power Semiconductors and ICs, May 2005, 4 pages.

\* cited by examiner

SOI DEVICES FOR PLASMA DISPLAY PANEL DRIVER CHIP

CROSS REFERENCE TO RELATED APPLICATIONS

This application is a national phase application of PCT/CN 2010/080433 filed on Dec. 29, 2010, which claims priority to Chinese Patent Application No.201010594793.6, entitled "SOI DEVICES FOR PLASMA DISPLAY PANEL DRIVER CHIP" and filed on Dec. 17, 2010 with the State Intellectual Property Office of PRC, which is incorporated herein by reference in its entirety.

FIELD OF THE INVENTION

The invention relates to the field of semiconductor device, and particularly to SOI devices for plasma display panel driver chip.

BACKGROUND OF THE INVENTION

With the emergence of multimedia and high-definition TVs, flat panel TV, with Plasma Display Panel (PDP) as a representative, comes into our daily lives. High-definition, digital and flat panel TVs have become the development tendency of color televisions. Because of advantages of wide viewing angle, fast response, small thickness, large screen and full digital operations, the PDP becomes an ideal display device of the high-definition digital TVs, large-size wall hung TVs and multimedia terminals, and thus has wide applications with good prospects.

With the development of the PDP to large size and high resolution, the number of driver chips required by a single screen is significantly increased, which presents requirements of multi-output and compact size for driver chips. In the PDP driver chip, high voltage devices, that output high voltages by logical control, occupy most of the area of the chip. Therefore, the design for the high voltage devices is of the greatest importance for the compact size of the chip. The performance and cost of the driver chip for the plasma display panel will directly decide the performance and cost of the PDP TV.

Document 1 (M. R. Lee, Oh-Kyong Kwon, S. S. Lee, et al., SOI High Voltage Integrated Circuit Technology for Plasma Display Panel Drivers, Proceedings of 1999 International Symposium on Power Semiconductor Devices and ICs, Vol. 11: 285-288) discloses 150V and 250V high voltage SOI integrated circuit (IC) technology using Extended Drain MOSFET (EDMOSFET) and dielectric isolation for PDP driver chips with line scanning and column addressing.

As shown in FIG. 1, the SOI IC of this technology is based on 0.8 μm CMOS and includes an n-type substrate 1, a 3 μm buried oxide layer 2 and a 5.5 μm SOI (Silicon-On-Insulator) layer 3, where HV-PMOS, HV-NMOS and LV-CMOS devices are arranged on it and are isolated from each other by dielectric isolation trenches formed by oxide layers 14 on the side walls of the trenches and filler 83 filled in the trenches. The SOI IC further includes: a deep n-type dopant well region 4; a deep p-type dopant well region 5; n-type dopant well regions 31, 32 and 34; an n-type buffer region 33; p-type dopant well regions 41, 42 and 43; n-type dopant heavily doped regions 51-54 and p-type dopant heavily doped regions 61-64 which form good ohmic contacts with metal electrode regions 91-97 respectively; a gate oxide layer 12; and polysilicon gate electrodes 81-83.

The HV-NMOS and the HV-PMOS are isolated by dielectric isolation trenches in a way of deep trench isolation in order to avoid latch-up. However, because of the relatively thick SOI layer, although the dielectric isolation SOI technology is employed, there are still large area PN junctions between the n-type dopant well region 32 and the deep p-type dopant well region 5 as well as between the p-type dopant well region 41 and the deep n-type dopant well region 4, and the advantages of low leakage current and low power consumption of the SOI technology are not put into full play; and because the deep trench dielectric isolation is employed, additional process steps such as deep trench etching, trench filling, planarization are required, which increase process cost. In addition, the withstand voltage of the buried oxide layer in the device is less than 90V/μm when the breakdown of the HV-NMOS and the HV-PMOS occurs.

Document 2 (Ming Qiao, Bo Zhang, Zhiqiang Xiao, Jian Fang, Zhaoji Li, High-Voltage Technology Based on Thin Layer SOI for Driving Plasma Display Panels, Proceedings of 2008 International Symposium on Power Semiconductor Devices and ICs, Vol. 20: 52-55) discloses a technology of thin layer SOI for PDP addressing driver circuits.

As shown in FIG. 2, the technology adopts a 2 μm buried oxide layer and a 1 μm SOI layer, and the SOI IC includes: a p-type substrate 1, a buried oxide layer 2 and an SOI layer 3, where high-voltage nLDMOS (n-channel Lateral Double-diffused MOSFET), high-voltage pLDMOS (p-channel Lateral Double-diffused MOSFET), low-voltage NMOS and low-voltage PMOS devices are arranged on the SOI layer 3 and are isolated from each other by LOCOS (Local Oxidation of Silicon). The SOI IC further includes: p-type dopant well regions 31, 33 which are used to form the body regions of the low-voltage NMOS and the high-voltage nLDMOS respectively; a p-type buffer region 32, a p-type drift region 34, n-type dopant well regions 41, 42 which are used to form the body regions of the low-voltage PMOS and the high-voltage pLDMOS respectively; an n-type buffer region 43; an n-type drift region 44; n-type dopant heavily doped regions 51-54; p-type dopant heavily doped regions 61-64; polysilicon gate electrodes 81-84; a field oxide layer 10; a p-type dopant field region 13; and LOCOS isolation regions 14.

In the above thin layer SOI technology, affected by back-gate depletion, the breakdown voltage of the pLDMOS is limited by the thickness of the SOI layer and the buried oxide layer. The buried oxide layer of the high-voltage device has a thickness of 2 μm, and when the breakdown of high-voltage nLDMOS and the high-voltage pLDMOS devices occurs, the withstand voltage of the buried oxide layer is less than 90V/μm.

Therefore, in the prior art, when the breakdown of the SOI devices occurs, the vertical withstand voltage of the buried oxide layer per unit of thickness is small.

SUMMARY OF THE INVENTION

The object of the present invention is to provide SOI devices for plasma display panel driver chips which have a better vertical withstand voltage property.

To solve the above problem, the present invention provides a technical solution as follows:

A SOI device for plasma display panel driver chip including a substrate, a buried oxide layer and an n-type SOI layer in a bottom-up order, where the SOI layer is integrated with an HV-NMOS device, an HV-PMOS device, a Field-PMOS device, an LIGBT device, a CMOS device, an NPN device, a PNP device and an HV-PNP device; and the SOI layer includes an n+ doped region within the SOI layer at the interface between the n-type SOI layer and the buried oxide layer.

Preferably, the n+ doped region has a higher doping concentration than the n-type SOI layer.

Preferably, each of the HV-NMOS device, the HV-PMOS device, the Field-PMOS device, the LIGBT device, the CMOS device, the NPN device and the HV-PNP device includes a p-type well region and an n-type well region, and the PNP device includes an n-type well region; and the n+ doped region has a height lower than a junction depth of any of the p-type well regions and the n-type well regions.

Preferably, the n+ doped region includes a first type n+ doped region located at a buried oxide layer region corresponding to at least one of the HV-NMOS device, the HV-PMOS device, the Field-PMOS device, the LIGBT device, the CMOS device and the HV-PNP device, and the first type n-type doped region is doped in spaced strips along the direction of the substrate and includes a plurality of sub-doped regions spaced apart.

Preferably, the n+ doped region includes a second type n+ doped region located at a buried oxide layer region corresponding to the NPN device or the PNP device, and the second type n+ doped region is continuously doped in a planar manner along the direction of the substrate and is distributed underneath and throughout a whole area of the NPN device and/or the PNP device.

Preferably, the buried oxide layer has a thickness in a range of 0.1 μm~1 μm.

Preferably, the SOI device is a high-voltage device in a 50V~300V PDP driver chip with column addressing and line scanning.

Preferably, each of the HV-PMOS device, the Field-PMOS device, the PNP device and the HV-PNP device is provided with a p-type RESURF (Reduced SURface Field) region underneath a field oxide layer; in each of the HV-PMOS device, the Field-PMOS device and the HV-PNP device, the p-type RESURF region is connected with the p-type well region and keeps a distance from or is connected with the n-type well region; and in the PNP device, the p-type RESURF region is connected with the n-type well region and a collector p-type heavily doped region, or the collector p-type heavily doped region is in the p-type RESURF region.

Preferably, the HV-NMOS device and/or the LIGBT device is provided with a p-type RESURF region underneath the field oxide layer.

Preferably, in each of the HV-PMOS device, the Field-PMOS device and the HV-PNP device, the p-type RESURF region has a smaller junction depth than the p-type well region.

Preferably, the Field-PMOS device is provided with a p-type field region in the n-type well region under the field oxide layer, each of the NPN device and the NMOS device in the CMOS device is provided with a p-type field region in the p-type well region underneath the field oxide layer of respective one of the NPN device and the NMOS device, and each of the p-type field region has a higher doping concentration than the n-type well regions and the p-type well regions.

Compared with the prior art, the above technical solution has the following advantages:

In the SOI devices for plasma display panel driver chip provided by the present invention, by arranging n+ doped regions in the n-type SOI layer at the interface between the n-type SOI layer and the buried oxide layer, with the doping concentration of n+ doped regions being higher than the doping concentration of the n-type SOI layer, when the SOI devices withstand a high voltage, a hole inversion layer is formed between adjacent n+ doped regions with holes being filled between two adjacent n+ doped regions, ionized N+ regions are formed at interfaces of the n+ doped regions to the buried oxide layer, and the action of the positive charges of the hole inversion layer and the ionized N+ regions not only enhances the electric field in the buried oxide layer but also weakens the electric field in the SOI layer, so that the buried oxide layer per unit of thickness can withstand higher vertical voltage when device breakdown occurs, and the limit on the vertical withstand voltage of the conventional SOI high-voltage device is broken.

BRIEF DESCRIPTION OF THE DRAWINGS

The above and other objectives, features and advantages will be more apparent with reference to the accompanying drawings. In the drawings, the same reference numerals indicate the same parts. The accompanying drawings may not be drawn to scale, so as not to unnecessarily obscure the embodiments of the present invention.

Figure 1:
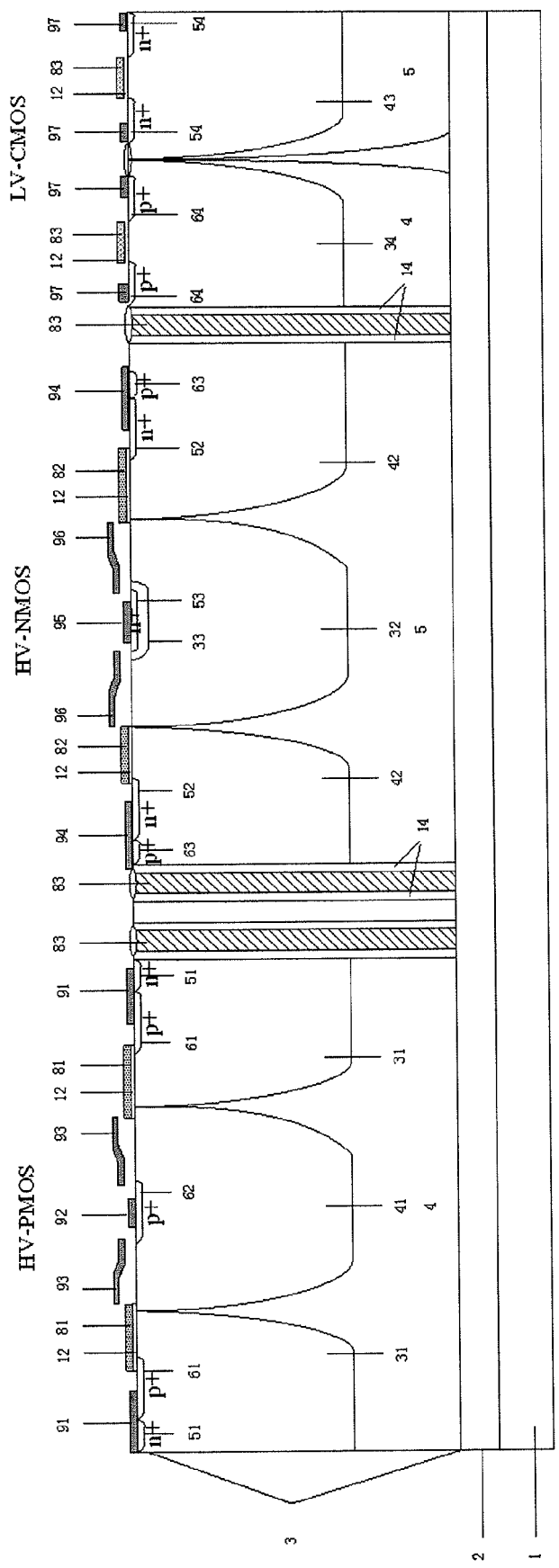
FIG. 1 is a structural cross-sectional view of SOI devices for a thick layer SOI plasma display panel driver chip in the prior art.
Figure 2:
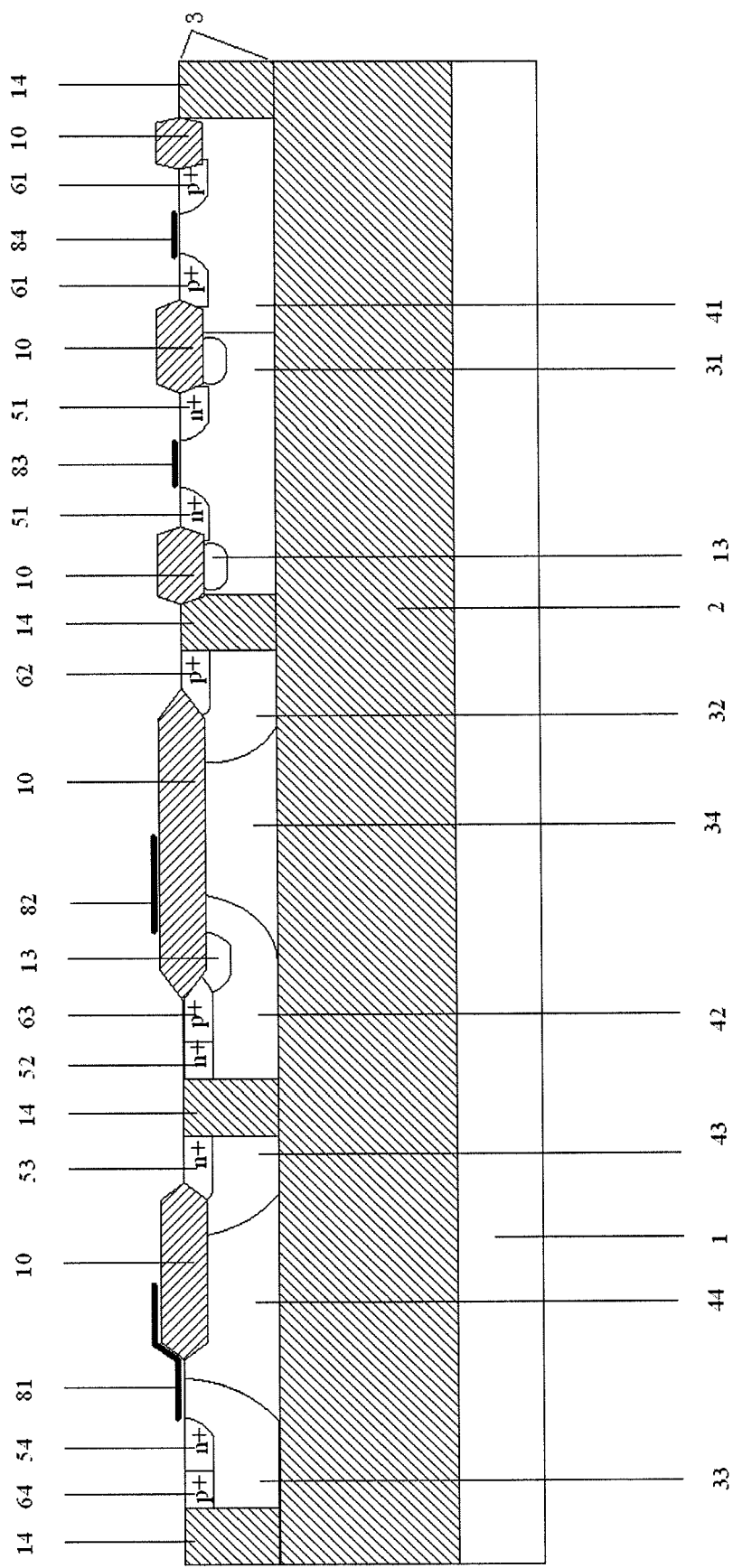
FIG. 2 is a structural cross-sectional view of SOI devices for a thin layer SOI plasma display panel driver chip in the prior art.
Figure 3:
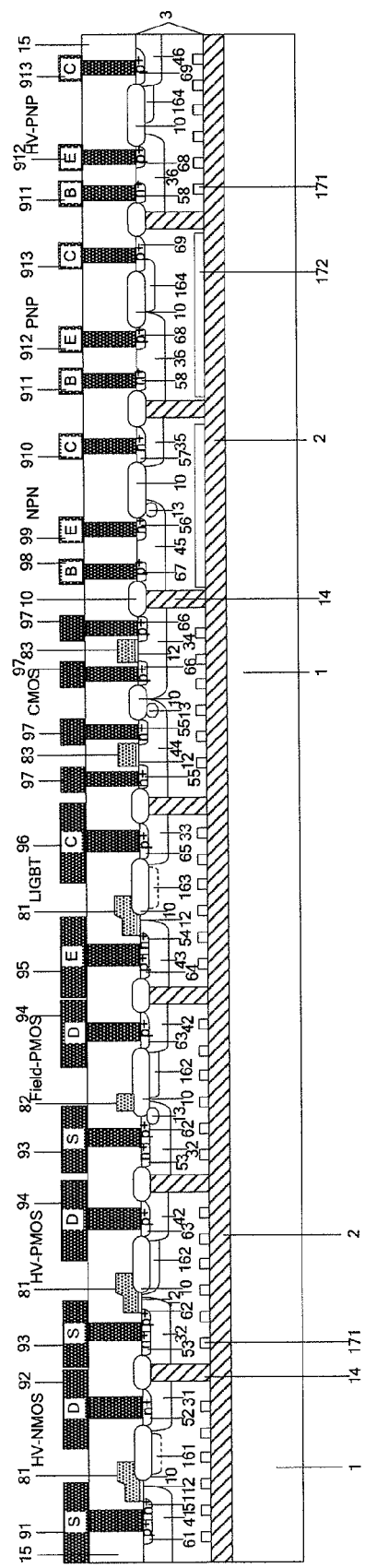
FIG. 3 is a structural cross-sectional view of SOI devices for plasma display panel driver chip provided by an embodiment of the present invention.

The following are illustrations on the reference numerals in FIG. 3.

1: substrate; 2: buried oxide layer; 3: SOI layer; 31-36: n-type well regions; 41-46: p-type well regions; 51-58: n-type heavily doped regions; 61-69: p-type heavily doped regions; 81-83: gate regions; 91-913: metal electrodes; 10: field oxide layer; 12: gate oxide layer; 13: p-type field region; 14: dielectric isolation region; 15: pre-metal dielectric layer; 161-164: p-type RESURF regions; 171-172: n+ doped regions.

DETAILED DESCRIPTION OF THE INVENTION

In the SOI devices for plasma display panel driver chip provided by the embodiment of the present invention, by arranging n+ doped regions in the n-type SOI layer at the interface between the n-type SOI layer and the buried oxide layer, with the doping concentration of n+ doped regions being higher than the doping concentration of the n-type SOI layer, when the SOI devices withstand a high voltage, a hole inversion layer is formed between adjacent n+ doped regions with holes being filled between two adjacent n+ doped regions, ionized N+ regions are formed at interfaces of the n+ doped regions to the buried oxide layer, and the action of the positive charges of the hole inversion layer and the ionized N+ regions not only enhances the electric field in the buried oxide layer but also weakens the electric field in the SOI layer, so that the buried oxide layer per unit of thickness may withstand higher vertical voltage when device breakdown occurs.

The technical solutions of the embodiments according to the present application will be described in more details with reference to the attached drawings, to make the above objectives, features, and advantages of the embodiment clearer.

More specific details will be set forth in the following descriptions for sufficient understanding of the disclosure, however the present invention may also be implemented by other ways different from the way described herein, similar extensions may be made by those skilled in the art without departing from the spirit of the present invention, therefore the present invention is not limited to particular embodiments disclosed hereinafter.

In addition, the present invention is described in conjunction with the schematic drawings. When describing the embodiments of the present invention in detail, for convenience of illustration, sectional views showing the structure of the device are enlarged partially and are not drawn to scale. The drawings are exemplary and are not intended to limit the protection scope of the invention. Furthermore, in an actual manufacture process, three-dimension sizes, i.e. length, width and depth should be considered.

FIG. 3 shows a structural cross sectional view of SOI devices for plasma display panel driver chip provided by an embodiment of the present invention. The SOI devices include a substrate 1, a buried oxide layer 2 and an n-type SOI layer 3 in a bottom-up order. An HV-NMOS device, an HV-PMOS device, a Field-PMOS device, an LIGBT device, a CMOS device, an NPN device, a PNP device and an HV-PNP device are integrated with the SOI layer 3, and these devices are electrically isolated from each other by dielectric isolation regions 14 or field oxide layers 10;

There are n+ doped regions 171 and 172 within the SOI layer 3 at the interface between the n-type SOI layer 3 and the buried oxide layer 2.

Moreover, the doping concentration of the n+ doped regions 171 and 172 is higher than the doping concentration of the n-type SOI layer 3.

In addition, as shown in FIG. 3, the n+ doped regions in the embodiment include a first type n+ doped region 171 and a second type n+ doped region 172. The first type n+ doped region is located at the buried oxide layer region corresponding to at least one of the HV-NMOS device, the HV-PMOS device, the Field-PMOS device, the LIGBT device, the CMOS device and the HV-PNP device, and is doped in spaced strips along the direction of the substrate and thus includes multiple sub-doped regions spaced apart. The second type n+ doped region 172 is located at the buried oxide layer region corresponding to the NPN device and/or the PNP device, and is continuously doped in a planar manner along the direction of the substrate, and is distributed underneath and throughout the whole area of the NPN device or the PNP device.

The principle for the function of the first n+ doped region 171 in the embodiment of the present invention is illustrated hereinafter in conjunction with FIG. 4. When the SOI devices in the embodiment withstand a high voltage, i.e. a high voltage is applied to the pin A, a hole inversion layer is formed between the two adjacent n+ doped regions 171a and 171b on the surface of the buried oxide layer 2 with holes being limited between the two adjacent n+ doped regions 171a and 171b; at the same time, ionized N+ regions are formed at interfaces of the n+ doped regions 171a and 17b to the buried oxide layer 2.

Figure 4:
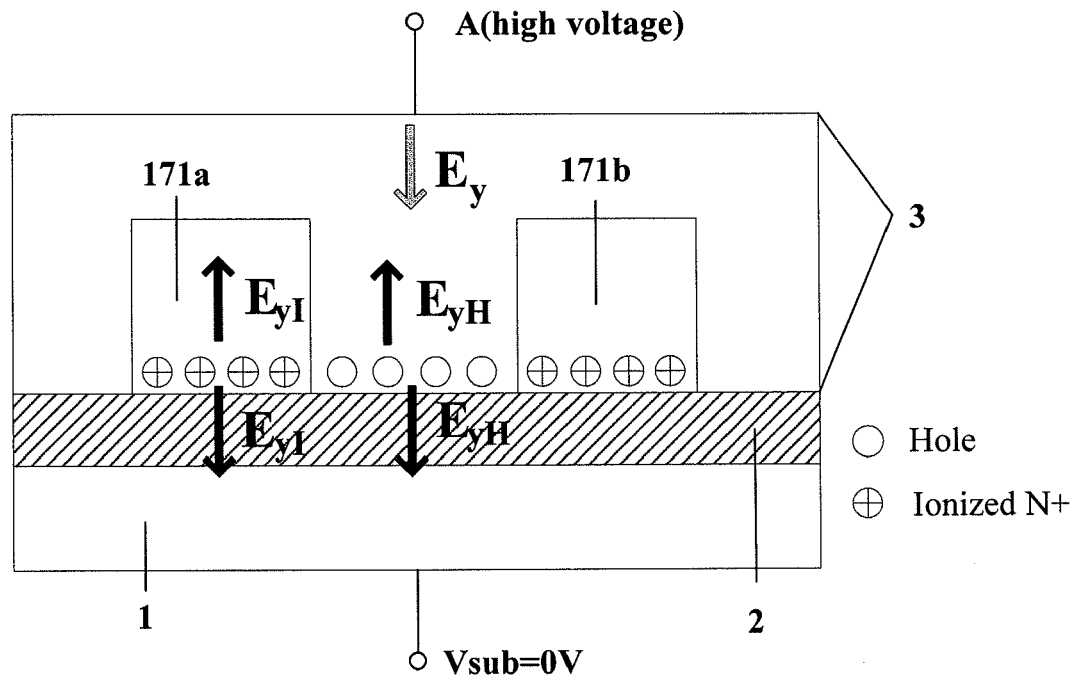
FIG. 4 is a schematic diagram showing the concept that the buried oxide layer of the SOI devices for plasma display panel driver chip provided by the embodiment of the present invention may have higher vertical withstand voltage.

As shown in FIG. 4, an electric field EyH (an electric field generated by the holes in the y direction) and an electric field EyI (an electric field generated by the ionized N+ in the y direction) in the vertical direction are formed respectively under the action of the positive charges of the hole inversion layer and the ionized N+ layer. Because the vertically downward electric field components of the EyH and EyI are in the same direction as the vertically downward electric field Ey generated by the high voltage applied to the pin A on the surface of the SOI layer 3, the electric field in the buried oxide layer 2 is enhanced; and because the vertically upward electric field components of the EyH and EyI is in a direction opposite to the vertically downward electric field generated by the high voltage applied to the pin A on the surface of the SOI layer 3, the vertical electric field in the SOI layer 3 is weakened. Hence, under the condition of a same bias voltage being applied on the pin A, the bulk electric field in the SOI layer 3 of the SOI high-voltage device of the present invention is decreased and is hard to reach the critical avalanche breakdown electric field of silicon, and in this way, the breakdown characteristics of the SOI high voltage device is improved greatly.

Furthermore, due to the increase of the electric field of the buried oxide layer and the decrease of the electric field of the SOI layer, the thickness of the buried oxide layer and the SOI layer may be smaller under the condition of same bias voltage. A high voltage SOI device with a requirement for a breakdown voltage of 50V~300V may be achieved using a buried oxide layer with a thickness of 0.1 μm~1 μm. Therefore, in the present invention, when the breakdown of the SOI high voltage device occurs, the buried oxide layer per unit of thickness may have a higher vertical withstand voltage, which breaks the limit on vertical withstand voltage of the conventional SOI high voltage device.

In the embodiment of the present invention, the second type n+ doped region 172 is located at the buried oxide layer region corresponding to the NPN and/or PNP device. A single continuous n+ doped region located on the surface of the buried oxide layer of the NPN device may decrease the collector resistance of the NPN device since the doping concentration of the n+ doped region is higher than the doping concentration of the SOI layer; a single continuous n+ doped region located on the surface of the buried oxide layer of the PNP device is mainly used to generate an upward built-in hole repulsion field to enhance hole absorption efficiency of the collector.

For the SOI high-voltage device in the prior art, since the vertical withstand voltage for the buried oxide layer per unit of thickness is lower, buried oxide layer requires a thicker thickness in order to meet the requirement for the device to withstand a higher voltage. However, the thickness of the buried oxide layer is limited in the manufacturing process, it is difficult to further increase the thickness of the buried oxide layer when the thickness of the buried oxide layer reaches a certain value; and due to the poor heat conductivity of the buried oxide layer, the SOI device with a thicker buried oxide layer will have serious self-heating effect, which will affect the performance of the device.

In contrast, for the SOI high-voltage device provided by the embodiment, due to the adding of the first type n+ doped region 171, the vertical withstand voltage of the buried oxide layer per unit of thickness is increased, and thus the thickness of the buried oxide layer may be further reduced while satisfying the high voltage that the device needs to withstand. The thickness of the buried oxide layer in the embodiment may be reduced to the range of 0.1 μm~1 μm. Due to the reduction of the thickness of the buried oxide layer, the self-heating effect of the SOI high voltage device is further decreased, and thus the performance of the device is enhanced.

Also, due to the improved vertical withstand voltage of the buried oxide layer per unit of thickness, the SOI high voltage device may adopt a buried oxide layer with a thinner thickness when a high voltage is applied, and thus the self-heating effect of the device is controlled. In turn, SOI device in the embodiment has an increased operation power and may be applied in 50V~300V PDP driver chip with column addressing and line scanning.

To sum up, for the SOI devices disclosed in the embodiment of the present invention, due to the adding of the n+ doped regions 171 and 172, the vertical withstand voltage of the buried oxide layer per unit of thickness is improved, the self-heating effect of the devices are reduced, so that the operation power of the SOI devices is improved and thus the whole performance of the SOI devices is improved, which satisfies the requirements of the line scanning driver chips and the column addressing plasma display panel driver chips.

The improvement in the performance of the SOI devices for plasma display panel driver chip disclosed in the embodiment of the present invention is illustrated above from macro level, and in the following the performance of the SOI devices will be illustrated in details in conjunction with the structure of respective devices in the SOI devices.

Referring to FIG. 3, the HV-NMOS device in the embodiment of the present invention includes:

a p-type well region 41 and an n-type well region 31 located within the surface of the SOI layer 3;

a source region located within the surface of the p-type well region 41, including a p-type heavily doped region 61 and an n-type heavily doped region 51;

a drain region located within the surface of the n-type well region 31, including an n-type heavily doped region 52;

a field oxide layer 10 located within the surface of the SOI layer 3 between the p-type well region 41 and the n-type well region 31, for adjusting the surface field of the HV-NMOS device;

a gate oxide layer 12 covering a part of the surface of the n-type heavily doped region 51 and a part of the surface of the p-type well region 41;

a gate region 81 located on the surface of the gate oxide layer 12 and partially crossing over the surface of the field oxide layer 10; and a source 91 located on the surface of the source region; a drain 92 located on the surface of the drain region; and a gate located on the surface of the gate region, where the source 91, the drain 92 and the gate are connected with the source region, the drain region and the gate region 81 respectively through via holes in a pre-metal dielectric layer 15 to form ohmic contact.

Furthermore, the HV-NMOS device in the embodiment further includes a p-type RESURF region 161 located beneath the field oxide layer 10. The p-type RESURF region 161 may form a double RESURF structure together with the n-type SOI layer 3, so as to reduce on-resistance of the HV-NMOS device while further improving the surface electric field distribution of the device. Of course, the effect of improving the withstand voltage of the buried oxide layer per unit of thickness may be achieved without the p-type RESURF region 161.

The p-type well region 41 forms the channel region of the HV-NMOS device to control the threshold voltage of the HV-NMOS device by the MOS structure formed by the gate oxide layer 12 and the gate region 81; the n-type well region 31 forms the drain buffer region of the HV-NMOS device to adjust the electric field distribution of the drift region.

When the drain 92 of the HV-NMOS device is applied with a high voltage, a hole inversion layer will be formed between two adjacent n+ doped regions on top of the buried oxide layer 2, and ionized N+ regions will be formed at interfaces of the n+ doped region to the buried oxide layer, and the action of the positive charges of the hole inversion layer and the ionized N+ layer enhances the electric field in the buried oxide layer 2 and reduces the electric field in the SOI layer 3, so that when the breakdown of the device occurs, the buried oxide layer per unit of thickness can withstand a higher vertical voltage, and the purpose of reducing the self-heating effect of the HV-NMOS device by reducing the thickness of the buried oxide layer in the case of ensuring high voltage and high power is achieved.

Figure 5:
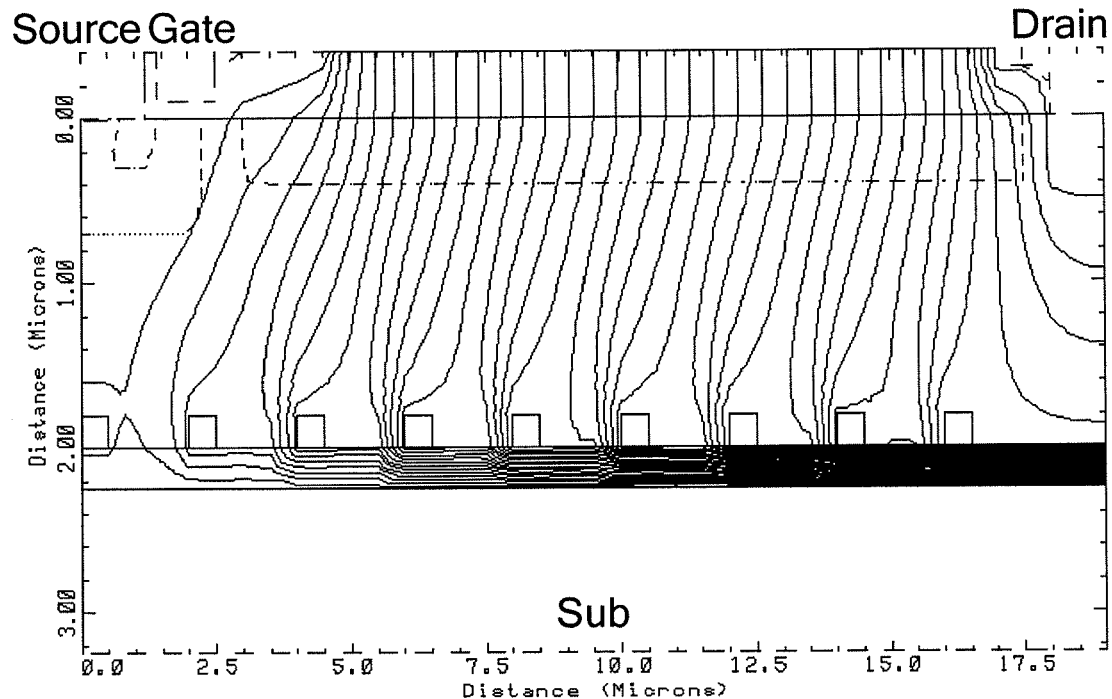
FIG. 5 shows the potential distribution when an HV-NMOS device in the SOI devices for plasma display panel driver chip provided by the embodiment of the present invention is broken down.
Figure 6:
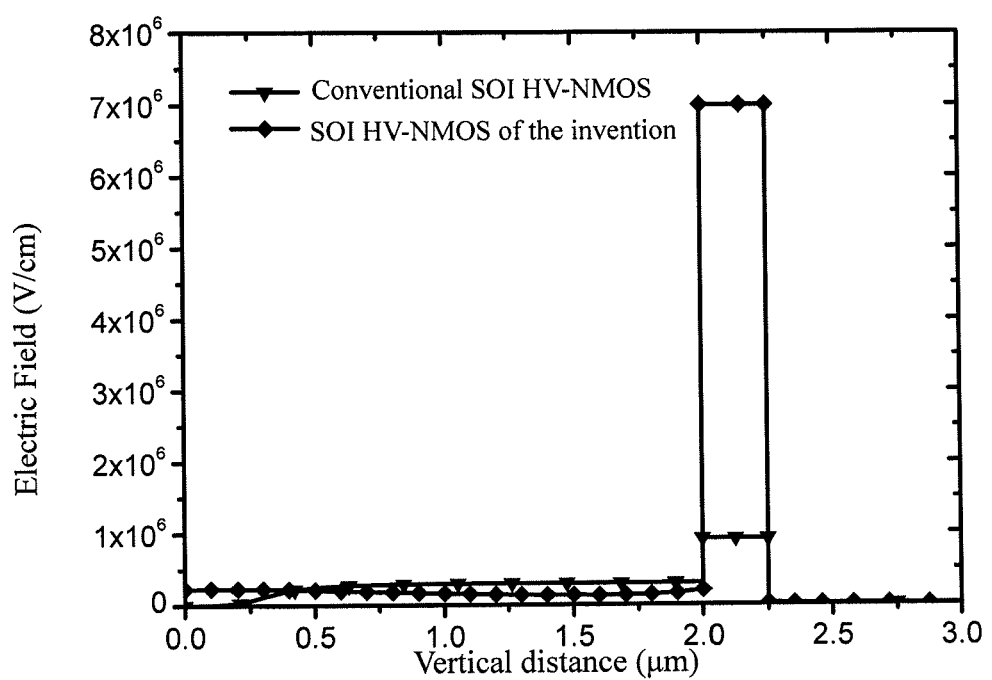
FIG. 6 shows the distribution of vertical electric fields under the drain when the HV-NMOS is at onset of breakdown for the SOI device provided by the embodiment of the present invention and for the conventional SOI device.

To illustrate the effect of the HV-NMOS device in the embodiment, references are made to FIG. 5 and FIG. 6. FIG. 5 is an equipotential curve distribution profile when the HV-NMOS device at onset of breakdown in the embodiment. The potential difference between two adjacent equipotential curves is 5V, the spacing between two adjacent n+ doped regions in FIG. 5 is 1.5 μm, the height of the n+ doped region is 0.2 μm, and the width of the n+ doped region is 0.5 μm. It may be seen from FIG. 5 that, the HV-NMOS device has an even equipotential curve distribution, where the equipotential curves in the buried oxide layer are in a dense distribution and the equipotential curves in the SOI layer are in a loose distribution.

FIG. 6 shows distribution of vertical electric fields at the drain when the HV-NMOS is at onset of breakdown for the SOI device provided by the embodiment of the present invention and for the conventional SOI device. It may be seen from FIG. 6 that when the breakdown occurs, the electric field intensity in the buried oxide layer 2 of the HV-NMOS device of the embodiment of the present invention reaches 7.0E6 V/cm, and the electric field intensity in the buried oxide layer 2 of the conventional HV-NMOS device is only 9.2E5 V/cm; also, the silicon electric field intensity at the interface of the buried oxide layer 2 and the n-type SOI layer 3 is reduced from 3.04E5 V/cm for the conventional HV-NMOS device to 2.03E5 V/cm for the HV-NMOS device of the embodiment of the present invention.

Therefore, it may be seen from FIG. 5 and FIG. 6 that in the HV-NMOS device of the embodiment of the present invention, the withstand voltage of the buried oxide layer per unit of thickness is improved, and the electric field withstood by the SOI layer is weakened significantly.

It should be noted that for respective n-type regions, the doped ion may be phosphor ion or other quinquevalence ions, and for respective p-type regions, the doped ion may be boron ion or other trivalence ions.

In the embodiment, the phrase "within the surface of the SOI layer 3" refers to a region extending downwardly from the surface of the SOI layer 3 to a certain depth, and the region forms a part of the SOI layer 3; the phrase "on the surface of the buried oxide layer 2" refers to a region above the surface of the buried oxide layer 2, and the region does not belong to the buried oxide layer 2. Meanings of other similar descriptions may be deduced in the same way.

Furthermore, in the embodiment the gate region 81 includes at least a gate polysilicon layer, and in other embodiments the gate region may further includes doped polysilicon or a lamination layer composed of polysilicon and metal silicide on the polysilicon.

Referring to FIG. 3, the HV-PMOS device in the embodiment of the present invention includes:

an n-type well region 32 and a p-type well region 42 located within the surface of the SOI layer 3;

a source region within the surface of the n-type well region 32, including a p-type heavily doped region 62 and an n-type heavily doped region 53;

a drain region located within the surface of the p-type well region 42, including a p-type heavily doped region 63;

a field oxide layer 10 located within the surface of the SOI layer 3 between the p-type well region 42 and the n-type well region 32, for adjusting the surface field of the HV-PMOS device;

a gate oxide layer 12 covering a part of the surface of the p-type heavily doped region 62 and a part of the surface of the n-type well region 32;

a gate region 81 located on the surface of the gate oxide layer 12 and partially crossing over the surface of the field oxide layer; and a source 93 located on the surface of the source region; a drain 94 located on the surface of the drain region; and a gate located on the surface of the gate region, where the source 93, the drain 94 and the gate are connected with the source region, the drain region and the gate region 81 respectively through via holes in the pre-metal dielectric layer 15 to form ohmic contacts;

The n-type well region 32 forms the channel region of the HV-PMOS device to control the threshold voltage of the HV-PMOS device by the MOS structure formed by the gate oxide layer 12 and the gate region 81; the p-type well region 42 forms the drain buffer region of the HV-PMOS device to adjust the electric field of the drift region.

Furthermore, the HV-PMOS device further includes a p-type RESURF region 162 located beneath the gate oxide layer 12 and the field oxide layer 10. The p-type RESURF region 162 serves as the drain extension region of the HV-PMOS device, one end of which is connected with the p-type well region 42, and the other end of which keeps a distance from the n-type well region 32 or is connected with the n-type well region 32.

When the source of the HV-PMOS device is applied with a high potential to withstand a high voltage, the depletion begins from a PN junction of the drain (a PN junction formed by the p-type well region 42 and the n-type SOI layer 3) in a depletion principle similar to that of the HV-NMOS device. Therefore, the HV-PMOS device may have the same withstand voltage as the HV-NMOS device under the same conditions, and the device is more compatible to satisfy the withstand voltage requirement on the high voltage device by the high voltage shift circuit.

When the HV-PMOS device is in on-state, a hole conductive path in the HV-PMOS device may be formed via the p-type heavily doped region 62, the surface inversion layer of the n-type well region 32, a surface accumulation layer of the n-type SOI layer 3, the p-type RESURF region 162, the p-type well region 42 and the p-type heavily doped region 63.

In a principle similar to that of the above HV-NMOS device, when the HV-PMOS is at breakdown, the buried oxide layer per unit of thickness may withstand a higher vertical withstand voltage, and therefore the purpose of reducing the self-heating effect of the HV-PMOS device by reducing the thickness of the buried oxide layer while ensuring high voltage and high power is achieved.

Referring to FIG. 3, in the embodiment of the present invention, the difference between the Field-PMOS device and the above HV-PMOS device lies in that the Field-PMOS device does not include the thin gate oxide layer 12, the field oxide layer 10 of the Field-PMOS device is directly connected with a p-type heavily doped region 62 within the surface of the n-type well region 32 and a p-type heavily doped region 63 within the surface of the p-type well region 42, a gate region 82 is located only on the field oxide layer 10, and a p-type RESURF region 162 is located only beneath the field oxide layer 10. The p-type RESURF region 162 serves as the drain extension region of the Field-PMOS device, which has one end connected with the p-type well region 42 and the other end kept a distance from the n-type well region 32 or connected with the n-type well region 32.

That is to say, the main difference between the Field-PMOS device and the above HV-PMOS device is that the gate oxide of the HV-PMOS device is a thinner gate oxide layer 12 while the gate oxide of the Field-PMOS device is the field oxide layer 10, and the field oxide layer covers the p-type field region 13 to provide a continuous hole conductive path for the device.

The n-type well region 32 forms the channel region of the Field-PMOS device to control the threshold voltage of the Field-PMOS device by the MOS structure formed by the field oxide layer 10 and the gate region 82; the p-type well region 42 forms the drain buffer region of the Field-PMOS device to adjust the electric field of the drift region. The field oxide layer 10 of the Field-PMOS device may also be used to adjust the surface field of the Field-PMOS.

Referring to FIG. 3, the LIGBT device in the embodiment of the present invention includes:

a p-type well region 43 and an n-type well region 33 located within the surface of the SOI layer 3;

a p-type heavily doped region 64 and an n-type heavily doped region 54 located within the surface of the p-type well region 43; a p-type heavily doped region 65 located within the surface of the n-type well region 33;

a field oxide layer 10 located within the surface of the SOI layer 3 between the p-type well region 43 and the n-type well region 33, for adjusting the surface field of the LIGBT device;

a gate oxide layer 12 covering a part of the surface of the n-type heavily doped region 54 and a part of the surface of the p-type well region 43;

a gate region 81 located on the surface of the gate oxide layer 12 and partially crossing over the surface of the field oxide layer 10, where similar to the material of the gate region, the gate region 81 includes at least a gate polysilicon layer and may further include doped polysilicon or a lamination layer composed of polysilicon and metal silicide on the polysilicon; and an emitter 95 located on the surfaces of the p-type heavily doped region 64 and the n-type heavily doped region 54; a collector 96 located on the surface of the p-type heavily doped region 65, where the emitter 95 forms ohmic contact with the p-type heavily doped region 64 and the n-type heavily doped region 54 through via holes in the pre-metal dielectric layer 15, and similarly, the collector 96 is connected with the p-type heavily doped region 65 through via hole in the pre-metal dielectric layer 15 to form ohmic contact.

Furthermore, the LIGBT device may further include a p-type RESURF region 163 located beneath the field oxide layer 10. The p-type RESURF region 163 may form a double RESURF structure together with the SOI layer 3. Similar to the p-type RESURF region 161 in the HV-NMOS device, the p-type RESURF region 163 may be omitted.

The p-type well region 43 forms the channel region of the LIGBT device to control the threshold voltage of the LIGBT device by the MOS structure formed by the gate oxide layer 12 and the gate region 81; the n-type well region 33 forms the collector buffer layer of the LIGBT device, and by configuring parameters of the n-type well region 33, the on-resistance and the switching loss of the LIGBT device may be optimized.

When the collector 96 of the LIGBT device is applied with a high voltage, a hole inversion layer is formed on the surface of the buried oxide layer 2 between two adjacent n+ doped regions, and ionized N+ regions are formed at interfaces of the n+ doped regions to the buried oxide layer. The action of the positive charges of the hole inversion layer and the ionized N+ regions enhances the electric field in the buried oxide layer 2 and reduces the electric field in the SOI layer 3, so that when the device is broken down, the buried oxide layer per unit of thickness may withstand a higher vertical withstand voltage, and therefore the purpose of reducing the self-heating effect of the LIGBT device by reducing the thickness of the buried oxide layer while ensuring high voltage and high power is achieved.

Referring to FIG. 3, the low voltage CMOS device in the embodiment of the present invention includes a low voltage NMOS device and a low voltage PMOS device. Specifically, the low voltage CMOS device includes:

a p-type well region 44 and an n-type well region 34 located within the surface of the SOI layer, where the p-type well region 44 forms the channel region of the low voltage NMOS device, and the n-type well region 34 forms the channel region of the low voltage PMOS device;

n-type heavily doped regions 55 located within the surface of the p-type well region 44; p-type heavily doped regions 66 located within the surface of the n-type well region 34, where the n-type heavily doped regions 55 form the source region and the drain region of the low voltage NMOS, and the p-type heavily doped regions 66 form the source region and the drain region of the low voltage PMOS;

gate oxide layers 12 located between the source region and the drain region of the low voltage NMOS as well as between the source region and the drain region of the low voltage PMOS; gate regions 83 located on the gate oxide layers 12;

a field oxide layer 10 located between the n-type heavily doped regions 55 and the p-type heavily doped regions 66 and crossing over the p-type well region 44 and the n-type well region 34;

a p-type field region 13 located beneath the field oxide layer of the low voltage NMOS device, where the p-type field region 13 may be used to prevent the turning on of the parasitical field transistor of the low voltage NMOS device.

Furthermore, the low voltage CMOS device further includes a source, a drain and a gate which form ohmic contacts with the source region, the drain region and the gate region 83 respectively through via holes in the pre-metal dielectric layer 15 (in FIG. 3 both the source and the drain region are indicated by reference numeral 97 without differentiation, which may be understood by those skilled in the art).

Similarly, the function of the n+ doped region in the low voltage CMOS device is similar to that in the above devices, i.e. improving the withstand voltage of the buried oxide layer per unit of thickness and reducing the self-heating effect of the device, which will not be described in detail herein.

Referring to FIG. 3, in the embodiment of the present invention, there is a continuous n+ doped region on the surface of the buried oxide layer 2 of the NPN device and the PNP device, which is the second type n+ doped region. The structures of the NPN device and the PNP device are described hereinafter respectively.

The NPN device in the embodiment includes:

a p-type well region 45 and an n-type well region 35 located within the surface of the SOI layer 3, where the p-type well region 45 forms the base region of the vertical NPN transistor, and the n-type well region 35 forms the collector extension region of the vertical NPN transistor, which may reduce the surface field of the collector region and the resistance of the collector region;

a p-type heavily doped region 67 and an n-type heavily doped region 56 located within the surface of the p-type well region 45; an n-type heavily doped region 57 located within the surface of the n-type well region 35;

a base 98 which forms good ohmic contact with the p-type heavily doped region 67 through via holes in the pre-metal dielectric layer 15; an emitter 99 which is connected with the n-type heavily doped region 56 through via holes in the pre-metal dielectric layer 15; a collector 910 which is connected with the n-type heavily doped region 57 through via holes in the pre-metal dielectric layer 15;

a field oxide layer 10 located within the surface of the SOI layer between the n-type heavily doped region 56 and the n-type heavily doped region 57; and a p-type field region 13 located beneath the field oxide layer 10 in the p-type well region 45, which may be used to prevent the turning on of the lateral parasitical NPN transistor.

The function of the single continuous n+ doped region 172 on the surface of the buried oxide layer 2 of the NPN transistor is similar to that of the n-type well region 35, i.e. reducing the resistance of the collector of the NPN device.

The low voltage PNP device in the embodiment of the present invention includes:

an n-type well region 36 and a collector p-type heavily doped region 69 located within the surface of the SOI layer 3, where the n-type well region 36 forms the base region of the low voltage PNP device;

a p-type heavily doped region 68 and an n-type heavily doped region 58 located within the surface of the n-type well region 36;

a field oxide layer 10 located within the surface of the SOI layer 3 between the p-type heavily doped region 68 and the collector p-type heavily doped region 69;

a p-type RESURF region 164 located beneath the field oxide layer 10, where the n-type well region 36 keeps a distance from the p-type RESURF region 164 or is connected with the p-type RESURF region 164; the p-type heavily doped region 69 is connected with the p-type RESURF region 164, or the p-type doped region 69 is in the p-type RESURF region 164; the p-type RESURF region 164 is the collector extension region of the low voltage PNP device, which may reduce the resistance of the collector;

a base 911, an emitter 912 and a collector 913 connected respectively with the n-type heavily doped region 58, the p-type heavily doped region 68, the collector p-type heavily doped region 69 through via holes in the pre-metal dielectric layer 15.

The function of the single continuous n+ doped region 172 on the surface of the buried oxide layer 2 of the low voltage PNP transistor is to generate a upward built-in hole repulsion field, so as to increase hole absorption efficiency of the collector.

Referring to FIG. 3, different from the low voltage PNP transistor mentioned above, the high-voltage PNP transistor (HV-PNP) in the embodiment of the present invention is added with a p-type well region 46 within the surface of the SOI layer 3. The p-type well region 46 forms the collector extension region of the HV-PNP transistor. Further, in the HV-PNP transistor, the single continuous second type n+ doped region 172 is divided into the first type n+ doped regions 171 arranged at certain intervals, and the p-type RESURF region 164 serving as the collector extension region of the HV-PNP transistor is not connected with the n-type well region 36 and the p-type heavily doped region 69, but is connected with the p-type well region 46 and the field oxide layer 10. The p-type RESURF region 164 is also used to form the collector extension region of the HV-PNP device.

When the HV-PNP transistor is applied with a high voltage, the voltage withstand principle at emitter-open breakdown voltage ($BV_{CBO}$) is similar to that of the HV-PMOS device, so that the HV-PMOS, HV-NMOS and HV-PNP device provided by the present invention may obtain substantially same breakdown voltage under a same length of withstand voltage region.

It may be seen from FIG. 3 that, the field oxide layers 10 are further arranged on the dielectric isolation regions 14 between the various devices, for isolating the low voltage devices, and the field oxide layers 10 located above the drift regions of the high voltage devices are used to adjust the surface field of the devices.

It should be noted that in the SOI devices of the embodiment of the present invention, the height of each of the n+ doped regions is lower than the junction depth of each of the p-type well regions (in FIG. 3 *indicated* with reference numerals 41-46) and the n-type well regions (in FIG. 3 indicated with reference numerals 31-36). That is to say, neither the p-type well regions nor the n-type well regions include the n+ doped regions.

Furthermore, it may be known from the above description that the p-type field regions 13 in different devices function differently. For the Field-PMOS device, the p-type field region 13 is connected with the p-type heavily doped region 62 to provide a continuous conductive path for the holes; in the low voltage NMOS transistor, the p-type dopant field region 13 may increase the threshold of the parasitical MOS transistor to prevent the turning on of the parasitical MOS field transistor; and in the vertical NPN transistor, the p-type doped field region 13 may prevent the turning on of the lateral NPN. However, regardless of the function, any of the p-type doped field regions 13 has a higher doping concentration than any of the p-type well regions (in FIG. 3 indicated with reference numerals 44, 45) and the n-type dopant well regions (in FIG. 3 indicated with reference numeral 32).

In addition, it should be noted that any of the p-type RESURF regions (in FIG. 3 indicated with reference numerals 161-164) in the above devices has a smaller junction depth than any of the p-type well regions (in FIG. 3 indicated with reference numerals 42, 46). That is to say, the junction depth of the p-type RESURF region 162 in each of the HV-PMOS and Field-PMOS devices is smaller than the junction depth of any of the p-type well regions 42 and the junction depth of the p-type RESURF region 164 in the HV-PNP device is smaller than the junction depth of the p-type well region 46. Similarly, if there are p-type RESURF regions 161 and 163 in the HV-NMOS device and the LIGBT device, the junction depth of the p-type RESURF regions 161 and 163 should be smaller than the junction depth of the p-type well regions 41 and 43.

To sump up, in the embodiment of the present invention, a high voltage lateral n-type LDMOS device (HV-NMOS), a high voltage thin gate oxide lateral p-type LDMOS device (HV-PMOS), a thick gate oxide p-type LDMOS device (Field-PMOS), a lateral insulated gate bipolar transistor (LIGBT), a low voltage CMOS transistor (low voltage NMOS and PMOS), an NPN transistor, a PNP transistor and a high voltage PNP transistor are integrated successfully on the SOI material having buried oxide layer charge islands, which may satisfy the requirement on BCD devices raised by the high performance chips. In the SOI devices of the present invention, the vertical withstand voltage of the buried oxide layer per unit of thickness is improved greatly. In turn, a thinner buried oxide layer may be obtained while satisfying the high-voltage requirement of the SOI devices and the self-heating effect of the SOI devices is reduced. Therefore, the operation efficiency of the device is improved greatly, and as a result, the SOI devices may be applied in 50V~300V driver chips.

The above mentioned are only preferred embodiments of the present invention, which are not intended to limit the present invention in any forms.

Although the present invention is disclosed in preferred embodiments as mentioned above, the preferred embodiments are not meant to restrict the present invention. Numerous modifications, variations and equivalent alternatives can be made by those skilled in the art based on the above disclosed method and technical contents without departing from the scope of the technical solutions. Therefore, any content that does not deviate from the technical solutions of the present invention, and any simple variations, equivalents and modifications made to the above embodiments based on the essence of the present invention fall in the scope of protection of the present invention.

The invention claimed is:

1. A SOI device for plasma display panel driver chip, comprising a substrate, a buried oxide layer and an n-type SOI layer in a bottom-up order, wherein the SOI layer is integrated with an HV-NMOS device, an HV-PMOS device, a Field-PMOS device, an LIGBT device, a CMOS device, an NPN device, a PNP device and an HV-PNP device; and the SOI layer comprises an n+ doped region within the SOI layer at an interface between the n-type SOI layer and the buried oxide layer.

2. The SOI device for plasma display panel driver chip according to claim 1, wherein the n+ doped region has a higher doping concentration than the n-type SOI layer.

3. The SOI device for plasma display panel driver chip according to claim 2, wherein each of the HV-NMOS device, the HV-PMOS device, the Field-PMOS device, the LIGBT device, the CMOS device, the NPN device and the HV-PNP device comprises a p-type well region and an n-type well region, and the PNP device comprises an n-type well region; and the n+ doped region has a height lower than a junction depth of any of the p-type well regions and the n-type well regions.

4. The SOI device for plasma display panel driver chip according to claim 3, wherein the n+ doped region comprises a first type n+ doped region located at buried oxide layer regions corresponding to at least one of the HV-NMOS device, the HV-PMOS device, the Field-PMOS device, the LIGBT device, the CMOS device and the HV-PNP device, or the first type n+ doped region is doped in spaced strips along the direction of the substrate and comprises a plurality of sub-doped regions spaced apart.

5. The SOI device for plasma display panel driver chip according to claim 4, wherein the n+ doped region comprises a second type n+ doped region located at a buried oxide layer region corresponding to the NPN device or the PNP device, and the second type n+ doped region is continuously doped in a planar manner along the direction of the substrate and is distributed underneath and throughout a whole area of the NPN device and/or the PNP device.

6. The SOI device for plasma display panel driver chip according to claim 5, wherein the buried oxide layer has a thickness in a range of 0.1 μm~1 μm.

7. The SOI device for plasma display panel driver chip according to claim 4, wherein the buried oxide layer has a thickness in a range of 0.1 μm~1 μm.

8. The SOI device for plasma display panel driver chip according to claim 3, wherein the buried oxide layer has a thickness in a range of 0.1 µm~1 µm.

9. The SOI device for plasma display panel driver chip according to claim 2, wherein the buried oxide layer has a thickness in a range of 0.1 µm~1 µm.

10. The SOI device for plasma display panel driver chip according to claim 1, wherein the buried oxide layer has a thickness in a range of 0.1 µm~1 µm.

11. The SOI device for plasma display panel driver chip according to claim 10, wherein the SOI device is a high voltage device in a 50V~300V PDP driver chip with column addressing and line scanning.

12. The SOI device for plasma display panel driver chip according to claim 1, wherein each of the HV-PMOS device, the Field-PMOS device, the PNP device and the HV-PNP device is provided with a p-type RESURF region underneath a field oxide layer,
   in each of the HV-PMOS device, the Field-PMOS device and the HV-PNP device, the p-type RESURF region is connected with the p-type well region and keeps a distance from or is connected with the n-type well region; and
   in the PNP device, the p-type RESURF region is connected with the n-type well region and a collector p-type heavily doped region, or the collector p-type heavily doped region is in the p-type RESURF region.

13. The SOI device for plasma display panel driver chip according to claim 12, wherein the HV-NMOS device and/or the LIGBT device is provided with a p-type RESURF region underneath a field oxide layer.

14. The SOI device for plasma display panel driver chip according to claim 13, wherein the Field-PMOS device is provided with a p-type field region in the n-type well region under the field oxide layer, each of the NPN device and a NMOS device in the CMOS device is provided with a p-type field region in the p-type well region underneath the field oxide layer of respective one of the NPN device and the NMOS device, and each of the p-type field region has a higher doping concentration than the n-type well regions and the p-type well regions.

15. The SOI device for plasma display panel driver chip according to claim 12, wherein in each of the HV-PMOS device, the Field-PMOS device and the HV-PNP device, the p-type RESURF region has a smaller junction depth than the p-type well region.

16. The SOT device for plasma display panel driver chip according to claim 15, wherein the Field-PMOS device is provided with a p-type field region in the n-type well region under the field oxide layer, each of the NPN device and a NMOS device in the CMOS device is provided with a p-type field region in the p-type well region underneath the field oxide layer of respective one of the NPN device and the NMOS device, and each of the p-type field region has a higher doping concentration than the n-type well regions and the p-type well regions.

17. The SOI device for plasma display panel driver chip according to claim 12, wherein the Field-PMOS device is provided with a p-type field region in the n-type well region under the field oxide layer, each of the NPN device and a NMOS device in the CMOS device is provided with a p-type field region in the p-type well region underneath the field oxide layer of respective one of the NPN device and the NMOS device, and each of the p-type field region has a higher doping concentration than the n-type well regions and the p-type well regions.

* * * * *

UNITED STATES PATENT AND TRADEMARK OFFICE
CERTIFICATE OF CORRECTION

PATENT NO.         : 8,704,329 B2                                Page 1 of 1
APPLICATION NO.    : 13/503684
DATED              : April 22, 2014
INVENTOR(S)        : Ming Qiao et al.

It is certified that error appears in the above-identified patent and that said Letters Patent is hereby corrected as shown below:

In the Claims:

Column 16, Claim 16, Line 14, please change "SOT" to "SOI".

Signed and Sealed this
Sixteenth Day of September, 2014

Michelle K. Lee
*Deputy Director of the United States Patent and Trademark Office*